United States Patent [19]
Ando

[11] Patent Number: 6,097,053
[45] Date of Patent: *Aug. 1, 2000

[54] SEMICONDUCTOR DEVICE HAVING A MULTI-WALL CYLINDRICAL CAPACITOR

[75] Inventor: Masateru Ando, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/916,061

[22] Filed: Aug. 21, 1997

[30] Foreign Application Priority Data

Aug. 22, 1996 [JP] Japan .................... 8-220892

[51] Int. Cl.⁷ .................... H01L 27/108; H01L 29/76; H01L 29/94
[52] U.S. Cl. .................... 257/308; 257/306; 257/309
[58] Field of Search .................... 257/306, 308, 257/309, 310

[56] References Cited

U.S. PATENT DOCUMENTS 5,142,438  8/1992  Reinberg et al. .................... 257/310

FOREIGN PATENT DOCUMENTS

| 62-48062 | 3/1987 | Japan | 257/309 |
| 6-21382 | 1/1994 | Japan | 257/308 |
| 6-120442 | 4/1994 | Japan | 257/308 |
| 6-151748 | 5/1994 | Japan | 257/308 |
| 6-169068 | 6/1994 | Japan | 257/308 |
| 7-14931 | 1/1995 | Japan | 257/308 |
| 7-130873 | 5/1995 | Japan | 257/308 |

*Primary Examiner*—Steven H. Loke

[57] ABSTRACT

A semiconductor memory device comprises a capacitor having a double-cylinder structure wherein a storage electrode has two cylindrical portions each opposing an upper electrode, with a capacitor insulating film disposed therebetween. The outer cylindrical portion has a smaller length than the inner cylindrical portion, thereby allowing the capacitor to have a smaller height as viewed toward the outer direction. The boundary between the memory array region and peripheral region has a moderate step to thereby prevent breakage of an overlying interconnection and reduce etching residue.

11 Claims, 6 Drawing Sheets

SEMICONDUCTOR DEVICE HAVING A MULTI-WALL CYLINDRICAL CAPACITOR

BACKGROUND OF THE INVENTION (a) Field of the Invention

The present invention relates to a semiconductor device having a multi-wall cylindrical capacitor and, in particular, to the structure of a storage capacitor in a semiconductor device such as a semiconductor memory device generally referred to as a dynamic random access memory (DRAM). The present invention also relates to a method for manufacturing the same.

(b) Description of the Related Art

Recently, with the enhancement of the integration level in LSI, the chip area for the LSI decreases from year to year. With a DRAM, for example, in which a memory cell comprises a combination of a single transistor and a single capacitor, a reduction in the area of the capacitor used for a data storage element generally results in a reduced capacitance, which degrades the stability of the data storage by the capacitor. To prevent the reduction in the capacitance as a result of the reduction in the area of the capacitor, a variety of structures and their improvements are proposed for the capacitor which include a stacked structure inclusive of a cylinder type and a fin type and a trench structure as well as other structures.

Figure 1:
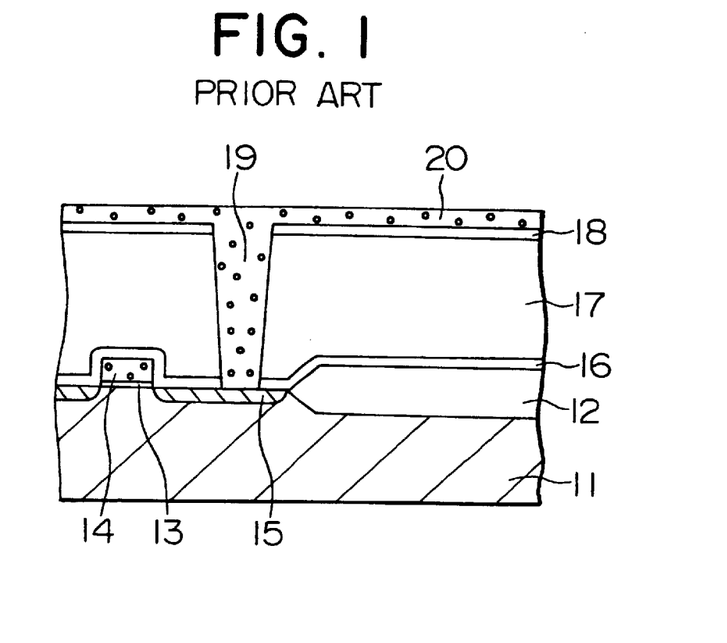
FIGS. 1 to 4 are cross-sectional views of a conventional semiconductor device having a storage capacitor, in consecutive steps of the method for manufacturing the same.

FIGS. 1 to 4 show cross-sections of a capacitor of a cylindrical type in a conventional DRAM, at the consecutive steps of a method for manufacturing the same. In FIG. 1, a LOCOS film or field oxide film 12 is formed on a p-type silicon substrate 11 in a non-active region for separation of adjacent elements, followed by formation of a gate electrode 14 from a polycrystalline silicon (polysilicon) on an active region separated by the field oxide film 12, with a gate oxide film 13 interposed between the gate electrode 14 and the silicon substrate 11. An n-type impurity is doped into the surface region of the silicon substrate 11 on the opposite sides of the gate electrode 14, using the gate electrode 14 itself as a mask, to form an n$^-$-type diffused regions 15 which serve as source/drain regions.

Figure 2:
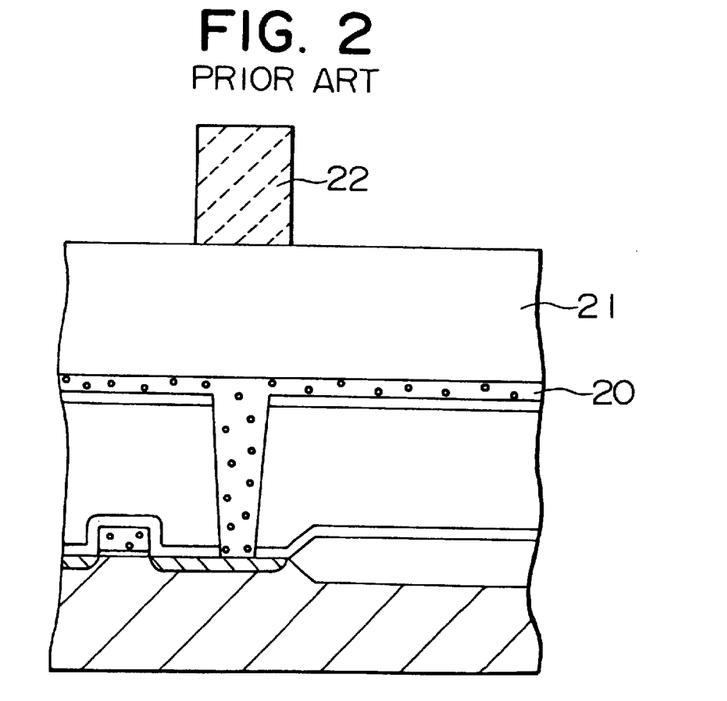

Subsequently, a first inter-layer dielectric film 16 is deposited on the entire surface of the p-type silicon substrate 11 inclusive of the gate electrode 14, followed by consecutive deposition of second and third interlayer dielectric films 17 and 18. The first to third interlayer dielectric films 16, 17 and 18 are selectively etched to form a contact-hole 19 for exposing one of the n$^-$-type diffused regions 15, then a first blanket polysilicon layer 20 is deposited over the entire surface of the substrate 11 to fill the opening 19. Thereafter, as shown in FIG. 2, a relatively thick oxide film 21 made of, for example, BPSG (Boro-Phospho-Silicate Glass) is deposited which later defines a central core for the structure of a capacitor cylinder. Using a photolithographic technique, a photoresist pattern 22 is formed to cover a portion of the oxide film 21 located above the contact hole 19.

Figure 3:
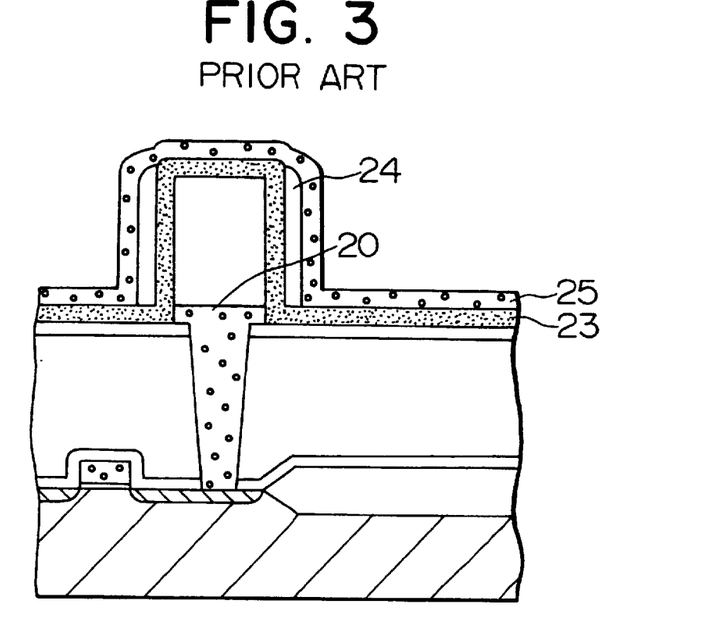

Thereafter, the oxide film 21 and polysilicon layer 20 are selectively etched by using the photoresist film 22 as a mask, followed by removal of the photoresist film 22, as shown in FIG. 3. Subsequently, a second blanket polysilicon film 23, which later defines an inner cylindrical portion of the storage electrode of the storage capacitor, and an oxide film 24 made of BPSG are consecutively deposited over the entire surface. Then, an etch-back of the oxide film 24 to define a sidewall insulator is effected, followed by deposition of a third blanket polysilicon layer 25 which later defines an outer cylindrical portion of the storage electrode.

Figure 4:
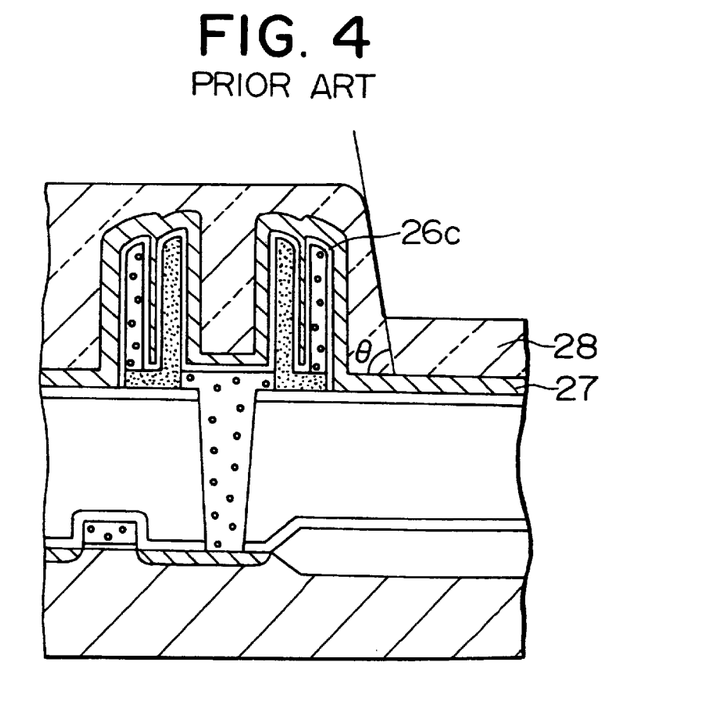

An etch-back of the third and second polysilicon layer 25 and 23 is then effected to form a storage electrode having a double cylinder structure, as shown in FIG. 4. In this step, the BPSG film 24 provides a side-wall insulator for forming an outer cylindrical portion 25 of the storage electrode of the storage capacitor by self-alignment. Then, the exposed oxide film 21 and oxide film 24 are removed by using hot phosphoric acid, for example. Then, a $Si_3N_4$ film, for example, is grown by a CVD process to form an insulating film 26c of the capacitor, followed by formation of a plate electrode 27 thereon. Finally, a fourth interlayer dielectric film 28 made of BPSG, for example, is deposited, followed by reflow thereof at 900° C. in a $N_2$ environment, for example.

In the semiconductor device as described above, a large step portion is formed on the interlayer dielectric film 28 at the boundary between the memory cell region having the storage capacitor and a peripheral circuit region. Even though the flatness of the interlayer dielectric film 28 can be improved to some degree by the reflow step as described above, it is difficult to substantially eliminate the step portion formed at the boundary. An angle (θ) of the step portion shown in FIG. 4 may be as high as 60° or greater. This causes problems of a breakage in an overlying interconnection layer and of an etching residue remaining in the vicinity of the boundary due to the etching step to form the overlying interconnection layer.

In addition, since the conventional semiconductor device requires a reflow heat treatment at an elevated temperature to improve the flatness of the interlayer dielectric film, a substance having a low heat resistance such as $Ta_2O_5$ cannot be suitably used as a material for the capacitor insulating film.

SUMMARY OF THE INVENTION

It is therefore an object of the present invention to form an interlayer dielectric film having a moderate step angle (θ) in the vicinity of the boundary between a region in which a storage capacitor of a multiple cylinder structure is formed and an adjacent region in the semiconductor device.

According to a first aspect of the present invention, there is provided a semiconductor device comprising a capacitor having first and second electrodes and a dielectric layer sandwiched between the first electrode and the second electrode, the first electrode including an inner cylindrical portion and an outer cylindrical portion having an axial length smaller than an axial length of the inner cylindrical portion.

According to a second aspect of the present invention, there is provided a method of manufacturing a semiconductor device comprising the steps of forming a MOSFET on a semiconductor substrate, forming a first dielectric film overlying the MOSFET and having an opening exposing one of source and drain of the MOSFET, depositing a first blanket polysilicon layer for filling the opening, forming a columnar dielectric film on a portion of the first polysilicon film overlying the opening, forming a second blanket polysilicon layer on the columnar dielectric film, forming a second dielectric film on the second polysilicon film, over-etching the second dielectric film by an etch-back process to thereby form a side-wall dielectric film having a height smaller than a height of the columnar dielectric film, forming a third blanket polysilicon layer on the side-wall dielectric film, etching-back the third blanket polysilicon layer to thereby remove the third polysilicon layer formed on other than the side-wall dielectric film, removing the columnar dielectric film and side-wall dielectric film to expose the first, second and third polysilicon layers, forming a third dielectric film on the exposed first, second and third polysilicon layers, and forming a second electrode on the third dielectric film.

In accordance with the semiconductor device according to the present invention and a semiconductor device manufactured by the method according to the present invention, a moderate step portion is formed at the boundary between the region for forming the storage capacitor therein and an adjacent region, to thereby prevent breakage of an overlying interconnection layer and an etching residue remaining in the vicinity of the boundary.

Since the method according to the present invention enables a flattening of the interlayer dielectric film without effecting a thermal treatment at an elevated temperature, a substance such as $Ta_2O_5$ which exhibits only a low heat resistance may be used as a material for the capacitor insulating film.

The above and other objects, features and advantages of the present invention will be more apparent from the following description, referring to the accompanying drawings.

DESCRIPTION OF THE PREFERRED EMBODIMENTS

Now, the present invention is more specifically described with reference to accompanying drawings, wherein similar constituent elements are designated by the same or similar reference numerals.

Figure 5:
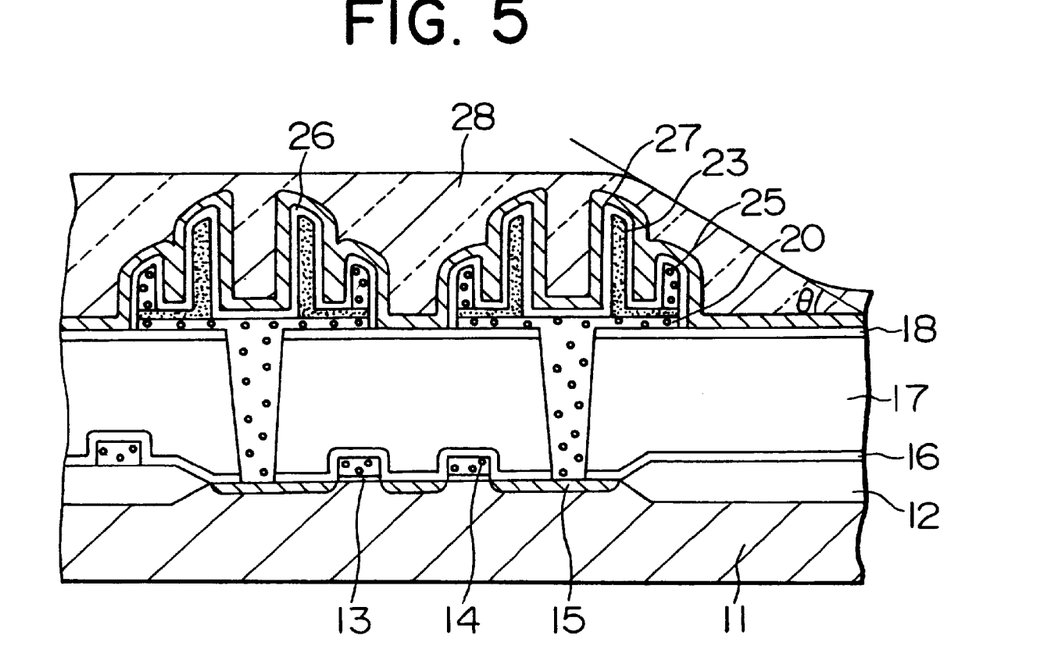
FIG. 5 is a cross-sectional view of a semiconductor device having a storage capacitor according to a first embodiment of the present invention.

Referring to FIG. 5, a semiconductor memory device according to a first embodiment of the present invention comprises a p-type silicon substrate 11, a field oxide 12 film formed in the non-active region on the silicon substrate 11 for defining a plurality of active regions, a plurality of memory cells formed in the active regions. The memory cell includes n-type source/drain regions 15 of a lightly doped drain (LDD) structure formed in the surface region of the silicon substrate 11, a gate oxide film 13 and gate electrode 14 consecutively formed on the silicon substrate 11 between a pair of source/drain regions 15, the gate electrode layer 14 defining a word line for the memory device.

A first interlayer dielectric film 16 is disposed over the silicon substrate 11 inclusive of the gate electrode 14. On the first interlayer dielectric film 16, second and third interlayer dielectric films 17 and 18 are consecutively formed. A contact hole extends through the interlayer dielectric films 16, 17 and 18 for exposing the surface of the $n^-$-type diffused region 15. A capacitor having a double cylinder structure is formed on the third interlayer dielectric film 18 and connected to one of the $n^-$-type diffused regions 15 through the contact-hole. A lower electrode or storage electrode of the storage capacitor is implemented by the first, second and third polysilicon layers 20, 23 and 25.

It is the feature of the storage capacitor in the present embodiment that the inner cylindrical portion of the storage electrode formed by the second polysilicon layer 23 has an elevation which is higher than the elevation of an outer cylindrical portion of the storage electrode defined by the third polysilicon layer 25. Such a difference on elevation can be achieved by an over-etching during the etch-back step for forming the sidewall insulator, which is used to form an outer cylindrical portion of the storage capacitor by self-alignment to the inner cylindrical portion of the storage capacitor.

A capacitor insulating film 26 is formed on the surface of the storage electrode, and a plate electrode 27 is formed thereon. The capacitor insulating film 26 may be made from one or more of $SiO_2$ film, $Si_3N_4$ film, SiON film and $Ta_2O_5$ film. The plate electrode 27 may be made from one or more of polysilicon film, metallic film, nitride film such as a TiN film, and silicide film such as a WSi film. A fourth interlayer dielectric film 28 made of BPSG is formed on the plate electrode 27. The fourth interlayer dielectric film 28 is subjected to a flattening treatment effected as a low temperature thermal treatment.

In accordance with the present embodiment, a step angle (θ) at the boundary between the memory cell region and the peripheral circuit region can be made moderate, and the occurrence of a breakage in the overlying interconnection layer or an etching residue can be prevented. During the step of improving the flatness of the fourth interlayer dielectric film 28, the flattening treatment can be conducted as a low temperature thermal treatment without using a high temperature reflow step, thereby allowing the use of a material which only exhibits a low heat resistance, such as $Ta_2O_5$, as a capacitor insulating film.

Figure 6:
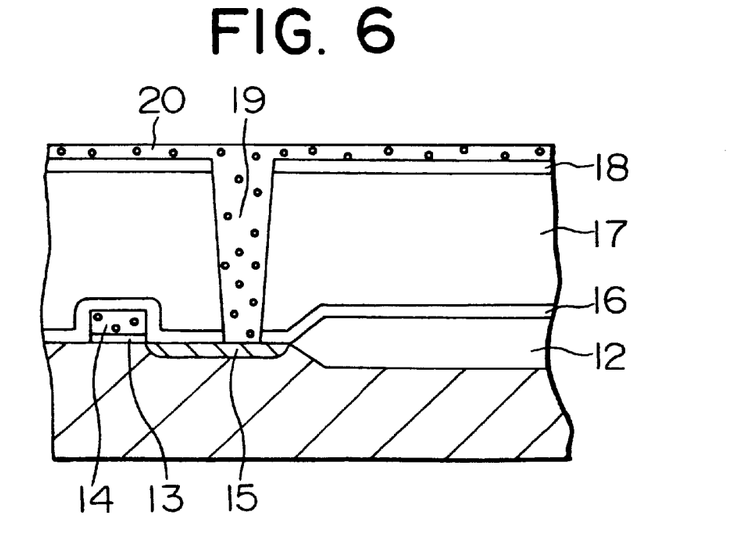
FIGS. 6 to 11 are cross-sectional views of the semiconductor device of FIG. 5, showing consecutive steps of a fabrication process according to an embodiment of the present invention.

FIGS. 6 to 10 consecutively show the steps of a fabrication process for the semiconductor device of FIG. 5. In FIG. 6, a field oxide film 12 having a thickness on the order of 400 nm is formed on a p-type silicon substrate 11 by a LOCOS technique, so as to define active regions. A gate oxide film 13 having a thickness on the order of 15 nm is formed on the active region by a thermal oxidation process. A blanket polysilicon layer having a thickness on the order of 200 nm is deposited on the gate oxide film 13, and is patterned using a photolithography and a dry etching technique, thereby defining a gate electrode 14 which also serves as a word line.

Subsequently, using the field oxide film 12 and the gate electrode 14 as a mask, an n-type impurity such as phosphorous is implanted into the surface region of the p-type silicon substrate 11 to form $n^-$-type diffused regions 15 of a LDD structure. Thereafter, first, second and third interlayer dielectric films 16, 17 and 18 such as $SiO_2$ layer and BPSG layer are consecutively deposited over the entire surface, then subjected to patterning using a photolithography and an anisotropic dry etching technique to define a contact hole 19 for exposing one of source/drain regions or $n^-$-type diffused regions 15. A first blanket polysilicon layer 20 which is to be formed as a part of the storage electrode is then deposited over the entire surface to a thickness on the order of 200 nm.

Figure 7:
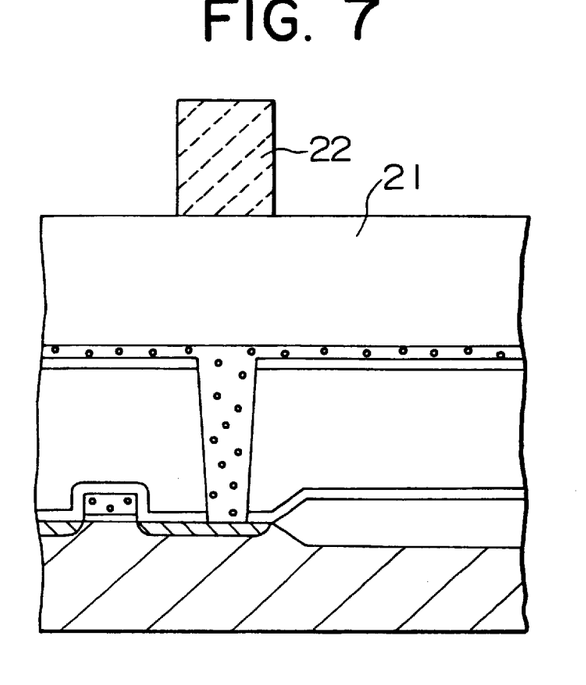

In FIG. 7, an oxide film 21 made of BPSG, for example, and having a thickness on the order of 500 nm is formed over the entire surface, the oxide film later defining a central core for the capacitor of a multi-layer cylindrical structure. A photoresist film 22 is then formed by spin-coating over the entire surface, then patterned by a photolithography to form a column overlying the contact hole 19. The cross-section of the column may be circular, square or rectangular shape.

Figure 8:
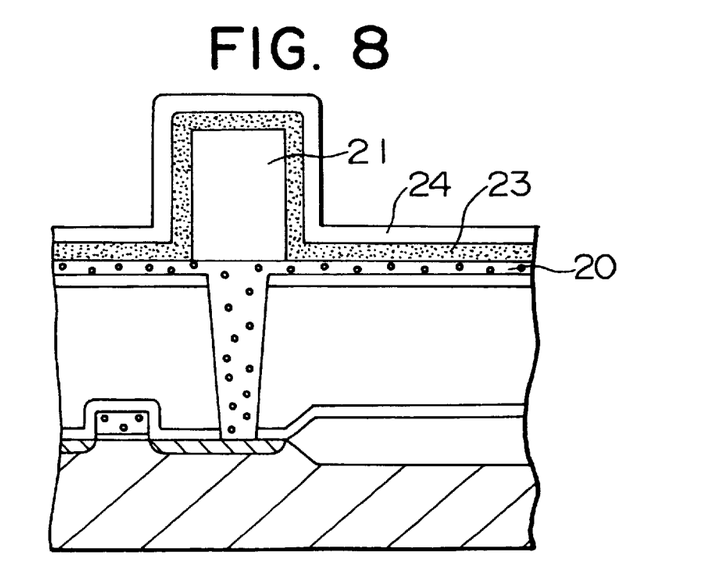

In FIG. 8, the oxide film 21 is selectively etched by using a dry etching technique, to form a central core for the capacitor of a cylindrical structure. The photoresist film is then removed, followed by consecutive deposition of a second blanket polysilicon layer 23, which later provides an inner cylindrical portion of the storage electrode of the capacitor, and an oxide film such as a BPSG film, which later provides a side-wall structure used to form an outer cylinder of the storage electrode in self-alignment to the inner cylinder of the storage electrode, to a thickness of 200 to 300 nm and 250 nm, respectively, over the entire surface.

Figure 9:
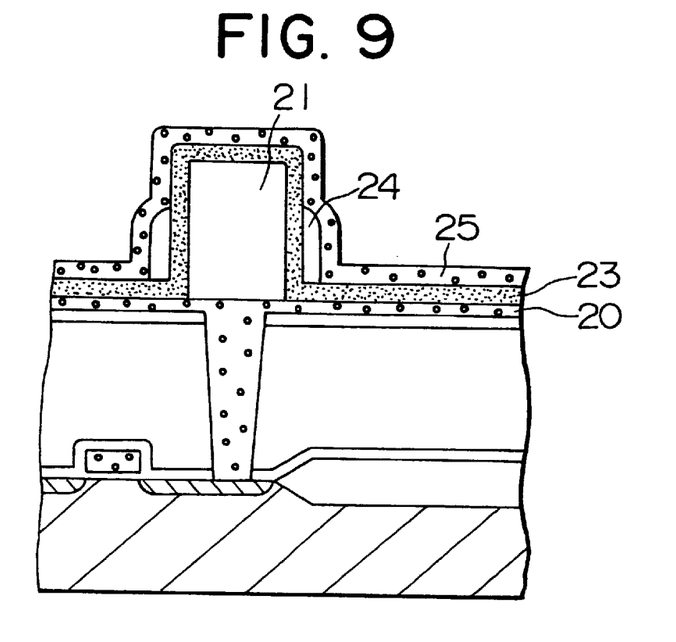

Subsequently, the oxide film 24 is etched-back by an anisotropic dry-etching technique effecting an over-etching, thereby forming a side wall 24 having an elevation which is on the order of 60% of the elevation of the oxide film 21, as shown in FIG. 9. In order to provide a sufficient difference in the elevation between the inner cylinder and outer cylinder of the storage electrode, the amount of the over-etch is determined on the order of 40% in the anisotropic dry-etching technique. A third blanket polysilicon layer 25 is then deposited over the entire surface, which later provides an outer cylinder disposed outside the inner cylinder of the storage electrode.

It is preferable to choose the amount of over-etch of the oxide film 24 in a range between 30% and 80% of the thickness of the oxide film 24, which provides the elevation of the resultant side-wall insulator 24 in a range between 40% and 80% of the elevation of the oxide film 21. Since the difference in the elevation between the inner cylinder and the outer cylinder of the storage electrode conforms to the difference in the elevation between the oxide films 21 and 24, the step angle (θ) defined on the surface of the overlying interlayer dielectric film can be made small by suitably choosing the elevation of the side-wall insualtor 24 in the range mentioned above.

Figure 10:
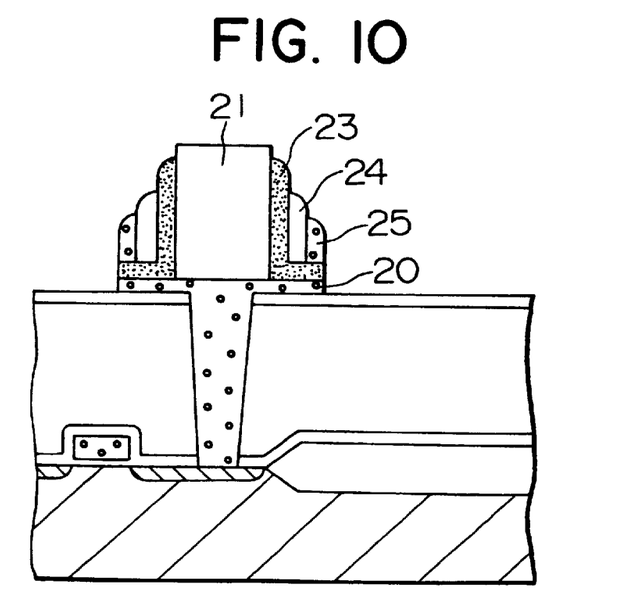

Subsequently, the first polysilicon layer 20 which provides a contact plug of the storage electrode, the second polysilicon layer 23 which provides the inner cylinder of the storage electrode, and the third polysilicon layer 25 which provides the outer cylinder of the storage electrode are etched-back using a reactive ion etching (RIE) technique, thereby defining the storage electrode having a double-cylinder structure, as shown in FIG. 10.

Figure 11:
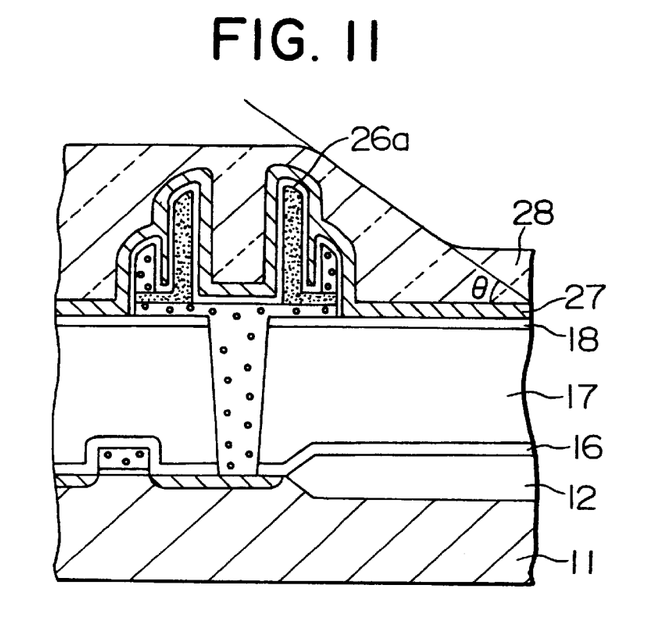

Thereafter, the oxide film 21 which has provided the central core for the capacitor structure up to this step, and the oxide film 24 which is disposed between the inner cylinder and the outer cylinder of the storage electrode are removed by a wet-etching technique using hot phosphoric acid, for example, as shown in FIG. 11. In the resultant structure, the difference in the elevation between the inner cylinder and the outer cylinder of the storage electrode is on the order of about 200 nm.

A nitride film such as $Si_3N_4$ film is then formed to a thickness on the order of 5 to 7 nm on the entire surface covering the first, second and third polysilicon layers 20, 23 and 25 by using a CVD process, for example. The entire surface of the nitride film is then oxidized at a temperature of 700 to 800° C. in $H_2$—$O_2$ ambient, for example, to form a capacitor insulating film 26a made of SiON.

Finally, a fourth blanket polysilicon layer is deposited over the entire surface to a thickness on the order of 200 nm to form a plate electrode 27, followed by growing a BPSG film, for example, over the entire surface to a thickness on the order of 500 nm to form a fourth interlayer dielectric film 28. A thermal treatment for reflow is then effected at a temperature of 900° C., for example, in a $N_2$ ambient for flattening. In the resulting semiconductor device, the step angle (θ) defined on the fourth interlayer dielectric film 28 is moderate as low as 40° or less.

Figure 12:
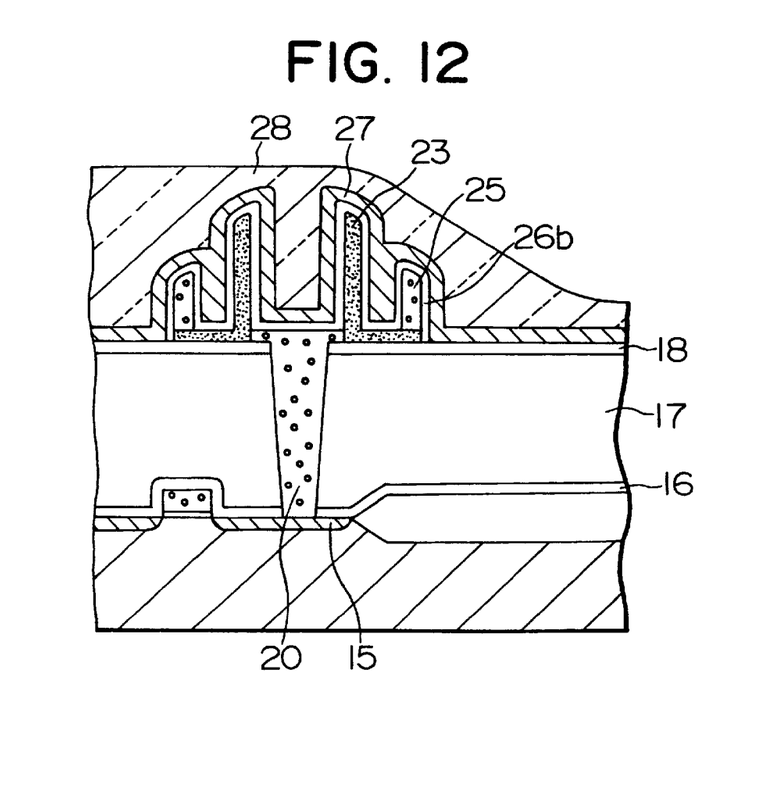
FIG. 12 is a cross-sectional view of a semiconductor device according to a second embodiment of the present invention.

Referring to FIG. 12, a semiconductor device according to a second embodiment of the present embodiment is manufactured by the steps obtained by modification of the steps used in the semiconductor device of the first embodiment. In the second embodiment, the oxide film 21 and the first polysilicon film 20 are patterned simultaneously, after the step shown in FIG. 7. Subsequently, the second and third polysilicon layers 23 and 25 are formed to define a storage electrode having a double cylinder structure.

A capacitor insulating film 26b made of $Ta_2O_5$ is then formed on the surface of the first, second and third polysilicon layers 20, 23 and 25. The capacitor insulating film 26b is formed to a thickness of 7 nm by a low pressure CVD (LPCVD) using a combination of $Ta(OC_2H_5)$ and $O_2$ as a reaction gas. Subsequently, a plate electrode 27 is formed from TiN, followed by growing a BPSG film to a thickness of 500 nm thereon as a fourth interlayer dielectric film 28. Then follows a thermal treatment for reflow at a temperature of 700° C. in a $N_2$ ambient for flattening.

Alternatively, the thermal treatment for reflow may be replaced by growing a fourth interlayer dielectric film 28 made of BPSG, for example, over the entire surface to the thickness on the order of 700 to 800 nm and a subsequent etch-back of the dielectric film 28 down to a thickness on the order of 200 to 300 nm by using BHF, for example.

While the present invention has been described above in connection with the embodiments thereof, it should be understood that the present invention is not limited thereto, but number of changes, modifications and substitutions can be easily made by those skilled in the art without departing from the scope and the spirit of the present invention.

For example, while the invention has been disclosed for a storage electrode having a double cylinder structure, a storage electrode having a triple or quadruple cylinder structure may also be used. In addition, an insulating film which is used as the central core for the cylinder structure or an insulating film which functions as a spacer between cylinders is not limited to BPSG, but any material can be chosen, so long as it can be etched selectively from the material implementing the storage electrode.

What is claimed is:

1. A semiconductor device comprising a capacitor having first and second electrodes and a dielectric layer sandwiched between said first electrode and said second electrode, said first electrode including an inner cylindrical portion and an outer cylindrical portion having a height substantially smaller than a height of said inner cylindrical portion and further having an insulating layer disposed over the first and second electrodes and over an adjoining region of the semiconductor device adjacent the capacitor so that said insulating layer has a step angle θ of 40° or less in the vicinity of a boundary between a region in which the capacitor is disposed and the adjoining region, said boundary having a sloping surface, said angle θ measured between a straight line extending from said sloping surface and a surface of the second electrode at the boundary, the second electrode comprising a plate electrode at the boundary.

2. The semiconductor device as defined in claim 1 wherein said second electrode has an intermediate cylindrical portion disposed between said inner cylindrical portion and said outer cylindrical portion.

3. The semiconductor device as defined in claim 2 further comprising a MOSFET having a source and a drain, wherein said first electrode further has a plug portion in direct contact with one of said source and drain.

4. The semiconductor device as defined in claim 1 wherein said dielectric layer comprises $Ta_2O_5$.

5. The semiconductor device as defined in claim 1 wherein the insulating layer comprises borophosphosilicate glass.

6. The semiconductor device as defined in claim 1, wherein the insulating layer is subjected to a flattening treatment to provide the step angle.

7. The semiconductor device as defined in claim 6 wherein the flattening treatment is conducted as a low temperature thermal treatment without using a high temperature reflow step, thereby allowing $Ta_2O_5$ to be used as the dielectric layer.

8. The semiconductor device as defined in claim 7, wherein the flattening treatment is conducted at a temperature of about 900° C.

9. The semiconductor device as defined in claim 7, wherein the flattening treatment is conducted at a temperature of about 700° C.

10. The semiconductor device as defined in claim 1, wherein the insulating layer is formed by depositing the insulating layer to a thickness of 700–800 nm and etching back the insulating layer to about 200 to 300 nm.

11. The semiconductor device as defined in claim 10, wherein the insulating layer is etched back using buffered hydro-fluoride.

* * * * *